(12) United States Patent
Park et al.

(10) Patent No.: US 12,029,096 B2
(45) Date of Patent: Jul. 2, 2024

(54) DISPLAY DEVICE

(71) Applicant: LG Display Co., Ltd., Seoul (KR)

(72) Inventors: Jeongmin Park, Paju-si (KR); Donghun Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/974,440

(22) Filed: Oct. 26, 2022

(65) Prior Publication Data

US 2023/0209964 A1 Jun. 29, 2023

(30) Foreign Application Priority Data

Dec. 23, 2021 (KR) .................... 10-2021-0186565

(51) Int. Cl.
| | |
|---|---|
| H10K 59/40 | (2023.01) |
| G06F 3/041 | (2006.01) |
| G06F 3/044 | (2006.01) |
| H10K 59/131 | (2023.01) |

(52) U.S. Cl.
CPC ......... *H10K 59/40* (2023.02); *G06F 3/04182* (2019.05); *G06F 3/0446* (2019.05); *H10K 59/131* (2023.02); *G06F 2203/04107* (2013.01); *G06F 2203/04112* (2013.01)

(58) Field of Classification Search
CPC .... H10K 59/131; H10K 59/00; H10K 59/126; H10K 59/40; G06F 3/0412; G06F 3/04164; G06F 3/04182; G06F 3/0443; G06F 3/0446; G06F 2203/04112; G06F 2203/04107

USPC ........................................... 345/76, 174, 173
See application file for complete search history.

(56) References Cited

U.S. PATENT DOCUMENTS

| | | | | |
|---|---|---|---|---|
| 2018/0032189 | A1* | 2/2018 | Lee | ............ G06F 3/0446 |
| 2020/0091252 | A1* | 3/2020 | Bang | ............ G06F 3/0446 |

FOREIGN PATENT DOCUMENTS

| | | |
|---|---|---|
| KR | 20200126473 A | 11/2020 |
| KR | 20210026454 A | 3/2021 |

* cited by examiner

*Primary Examiner* — Jimmy H Nguyen
(74) *Attorney, Agent, or Firm* — Seed IP Law Group LLP

(57) ABSTRACT

A display device includes a substrate including an active area including a plurality of pixels, and a non-active area; a plurality of light emitting elements in the active area on the substrate; an emission driver and a plurality of emission clock lines in the non-active area; a connection pattern on the emission driver and the plurality of emission clock lines in the non-active area and formed of the same material as an anode; an encapsulation layer on the plurality of light emitting elements and the connection pattern; a touch sensing unit on the encapsulation layer in the active area; a low potential power line disposed more outwardly than the plurality of emission clock lines in the non-active area; and a shielding layer between the connection pattern, and the emission driver and the plurality of emission clock lines in the non-active area and electrically connected to the low potential power line.

20 Claims, 9 Drawing Sheets

DISPLAY DEVICE

CROSS-REFERENCE TO RELATED APPLICATIONS

This application claims the benefit of and priority to Korean Patent Application No. 10-2021-0186565 filed on Dec. 23, 2021, in the Republic of Korea, the entire contents of which are hereby expressly incorporated by reference into the present application.

BACKGROUND

Technical Field

The present disclosure relates to a display device, and more particularly, to a display device with an integrated touch screen allowing for an improvement in touch performance.

Description of the Related Art

In accordance with the advance of the information society, demand for display devices displaying an image is increasing, and various types of display devices such as liquid crystal display devices (LCDs), organic light emitting display devices (OLEDs), quantum dot light emitting display devices (QLEDs), and inorganic light emitting display devices are being used.

Among the display devices described above, since the quantum dot light emitting display devices, the inorganic light emitting display devices, and the organic light emitting display devices are self-luminous devices and can be implemented to be thin and have excellent functions in terms of a response speed, a viewing angle, color reproducibility, and the like, they have recently come to prominence.

In addition, display devices can be operated by receiving a user's command through various input devices such as a keyboard and a mouse, and input devices of touch screen display devices allowing a user's command to be input intuitively and conveniently by touching a screen of the display device are being developed. A touch screen is disposed on the screen of the display device, and when a user touches a specific point on the screen of the display device, the display device may receive the user's command. Since the touch screen senses touch coordinates, it may be referred to as a touch sensing unit.

BRIEF SUMMARY

An aspect of the present disclosure provides a display device with an integrated touch screen, including a shielding layer allowing for minimization or reduction of touch noise.

An aspect of the present disclosure provides a display device with an integrated touch screen, capable of preventing a degradation in touch performance so that accurate touch sensing is allowed.

An aspect of the present disclosure provides a display device with an integrated touch screen, capable of securing a design margin of a cathode electrode by separately disposing a shielding layer capable of preventing a driving signal noise.

An aspect of the present disclosure provides a display device with an integrated touch screen that minimizes or reduces an outgassing defect in a planarization layer by disposing a shielding layer configured to allow for outgassing.

Technical benefits of the present disclosure are not limited to the above-mentioned technical benefits, and other technical benefits, which are not mentioned above, can be clearly understood by those skilled in the art from the following descriptions.

A display device according to an example embodiment of the present disclosure may include a substrate including an active area including a plurality of pixels, and a non-active area; a plurality of light emitting elements disposed in the active area on the substrate; an emission driver and a plurality of emission clock lines disposed in the non-active area; a connection pattern disposed above the emission driver and the plurality of emission clock lines in the non-active area and formed of the same material as an anode of the light emitting element; an encapsulation layer disposed on the plurality of light emitting elements and the connection pattern; a touch sensing unit disposed on the encapsulation layer in the active area; a low potential power line disposed more outwardly than the plurality of emission clock lines in the non-active area; and a shielding layer disposed between the connection pattern, and the emission driver and the plurality of emission clock lines in the non-active area and electrically connected to the low potential power line.

Other detailed matters of the example embodiments are included in the detailed description and the drawings.

Techniques of the present disclosure, among other, reduce the interference between a driving signal and a touch signal in a display panel occurs when a cathode electrode is not disposed to overlap all touch routing lines.

Techniques of the present disclosure, among others, reduce touch noise and enable stable touch sensing despite a design margin of a cathode electrode.

Techniques of the present disclosure, among others, improve touch precision by reducing noises that reach a touch sensing unit.

Techniques of the present disclosure, among others, reduce an outgassing defect in a planarization layer under a shielding layer.

The technical effects according to the present disclosure are not limited to the contents exemplified above, and more various effects are included in the present specification.

DETAILED DESCRIPTION

Figure 1:
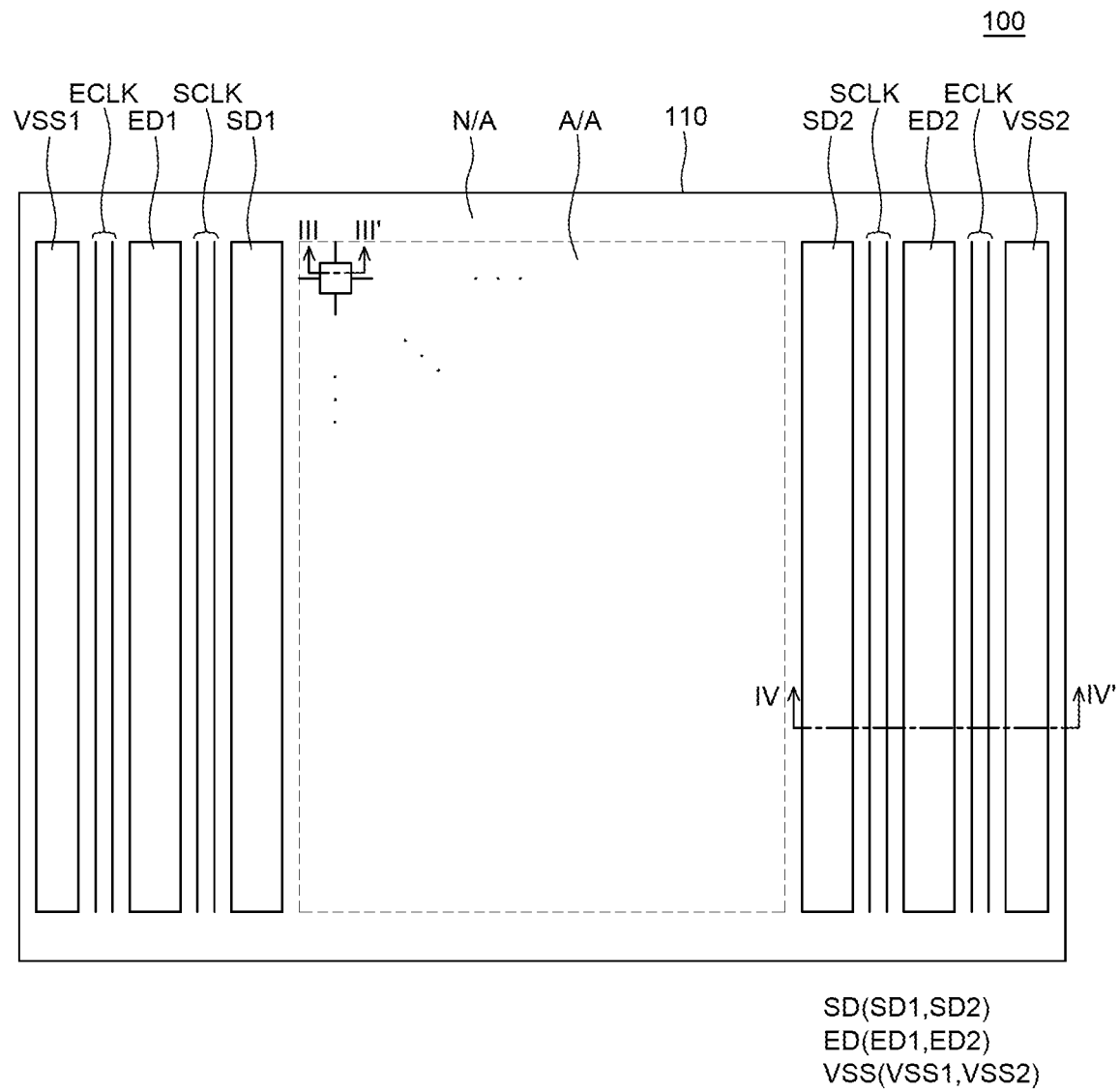
FIGS. 1 and 2 are schematic plan views of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" an element or layer, a layer or an element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

Display devices with an integrated touch screen according to example embodiments of the present disclosure may provide both a function for displaying an image and a function for sensing a touch.

In order to provide the function for displaying an image, a display device with an integrated touch screen according to example embodiments of the present disclosure may include a display panel in which a plurality of data lines and a plurality of gate lines are disposed and a plurality of sub-pixels defined by the plurality of data lines and the plurality of gate lines are arranged; a data driving circuit for driving the plurality of data lines; a gate driving circuit for driving the plurality of gate lines; a display controller for controlling operations of the data driving circuit and the gate driving circuit.

Each of the data driving circuit, the gate driving circuit, and the display controller may be implemented as one or more individual components. In some cases, two or more of the data driving circuit, the gate driving circuit, and the display controller may be implemented to be integrated into one component. For example, the data driving circuit and the display controller may be implemented as one integrated circuit chip (IC Chip).

In order to provide the function for sensing a touch, a display device with an integrated touch screen according to example embodiments of the present disclosure may include a touch panel including a plurality of touch electrodes; and a touch sensing circuit that supplies a touch driving signal to the touch panel, detects a touch sensing signal from the touch panel, and senses presence or absence of a user's touch or a touch position (touch coordinates) on the touch panel based on the detected touch sensing signal.

The touch sensing circuit may include, for example, a touch driving circuit that supplies a touch driving signal to the touch panel and detects a touch sensing signal from the touch panel, a touch controller that senses presence or absence of a user's touch and/or a touch position on the touch panel based on the touch sensing signal detected by the touch driving circuit, and the like.

The touch driving circuit may include a first circuit part for supplying the touch driving signal to the touch panel and a second circuit part for detecting the touch sensing signal from the touch panel.

The touch driving circuit and the touch controller may be implemented as separate parts or, in some cases, may be implemented to be integrated into one component.

Meanwhile, each of the data driving circuit, the gate driving circuit, and the touch driving circuit may be implemented as one or more integrated circuits and may be implemented as a chip on glass (COG) type, a chip on film (COF) type, a tape carrier package (TCP) type or the like in an aspect of electrical connection with a display panel, and the gate driving circuit may be implemented as a gate in panel (GIP) type.

Meanwhile, each of circuit components for display driving and circuit components for touch sensing may be implemented as one or more individual components. In some cases, one or more of the circuit components for display driving and one or more of the circuit components for touch sensing may be functionally integrated and implemented as one or more components.

For example, the data driving circuit and the touch driving circuit may be integrated into one integrated circuit chip or two or more integrated circuit chips. When the data driving circuit and the touch driving circuit are implemented to be integrated into two or more integrated circuit chips, each of the two or more integrated circuit chips may have a data driving function and a touch driving function.

Meanwhile, the display device with an integrated touch screen according to example embodiments of the present disclosure may be of various types such as an organic light emitting display device, a liquid crystal display device and the like. Hereinafter, for convenience of description, the display device with an integrated touch screen will be described as an organic light emitting display device as an example. That is, the display panel may be of various types, such as an organic light emitting display panel, a liquid crystal display panel and the like. Hereinafter, for convenience of description, the display panel will be described as an organic light emitting display panel.

Meanwhile, as will be described later, the touch panel may include a plurality of touch electrodes to which the touch driving signal can be applied or from which the touch sensing signal can be detected, and a plurality of touch routing lines for connecting the plurality of touch electrodes with the touch driving circuit.

The touch panel may exist outside the display panel. That is, the touch panel and the display panel may be separately manufactured and combined. Such a touch panel is referred to as an external type or an add-on type.

Unlike this, the touch panel may be built into the display panel. That is, when manufacturing the display panel DISP, touch sensor structures such as the plurality of touch electrodes and the plurality of touch routing lines constituting the touch panel may be formed together with electrodes and signal lines for display driving. Such a touch panel is referred to as a built-in type. Hereinafter, for convenience of description, a case in which the touch panel is a built-in type will be described as an example.

Figure 2:
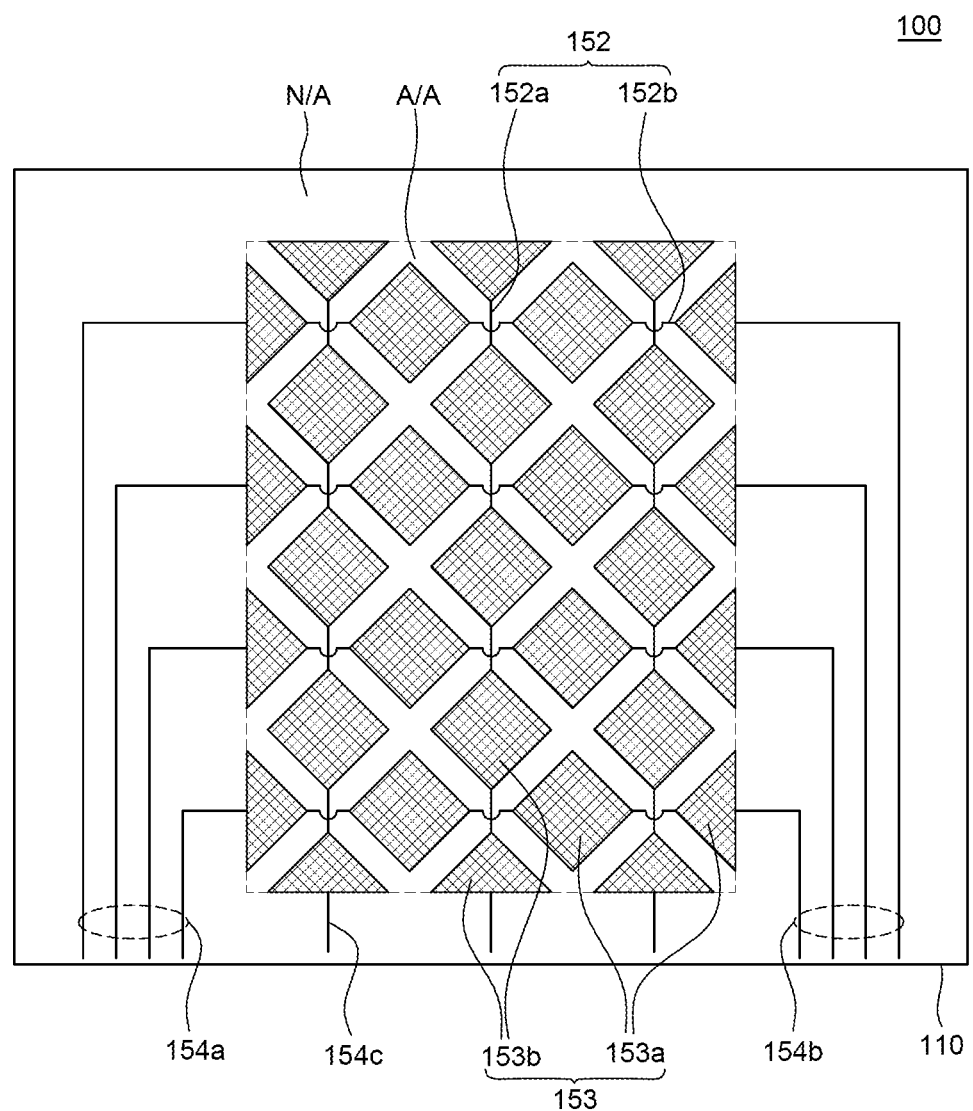

FIGS. 1 and 2 are schematic plan views of a display device according to an example embodiment of the present disclosure. FIG. 1 illustrates only a substrate 110, scan drivers SD, emission drivers ED, and clock lines SCLK and ECLK among various components of a display device 100 for convenience of illustration. FIG. 2 illustrates only touch electrodes 153, touch routing lines 154a and 154b, and sensing lines 154c among various components of the display device 100 for convenience of illustration.

Referring to FIG. 1, the substrate 110 of the display device 100 according to the present disclosure includes an active area A/A, and a non-active area N/A.

The substrate 110 is a component to support various components included in the display device 100 and may be formed of an insulating material. For example, the substrate 110 may be formed of glass or resin or the like. In addition, the substrate 110 may include a polymer or plastic, or may be formed of a material having flexibility.

The active area A/A is an area in which a plurality of sub-pixels are disposed to display an image. Each of the plurality of sub-pixels are individual units emitting light, and light emitting elements and driving circuits are formed in each of the plurality of sub-pixels.

The non-active area N/A is an area in which an image is not displayed, and is disposed to surround an outside of the active area A/A. The non-active area N/A is an area in which various lines and driving circuits for driving the sub-pixels disposed in the active area A/A are disposed.

In the display device 100, the data lines are disposed in the active area A/A, and a scan driving circuit unit may be disposed in the non-active area N/A, in a direction parallel to the data lines of the active area A/A. The scan driving circuit unit may include the scan driver SD, the emission driver ED, and a plurality of the clock lines SCLK and ECLK that are disposed along at least one side surface of the active area A/A in the direction parallel to the data line. The scan drivers SD may include a first scan driver SD1 and a second scan driver SD2 that output scan signals to a plurality of scan lines that are one type of gate lines. The emission drivers ED may include a first emission driver ED1 and a second emission driver ED2 that output emission control signals to a plurality of emission control lines that are the other type of the gate lines.

The first scan driver SD1, the second scan driver SD2, the first emission driver ED1, and the second emission driver ED2 are implemented in a GIP type and may be disposed in a GIP area within the non-active area N/A of the substrate 110. Alternatively, some of the first scan driver SD1, the second scan driver SD2, the first emission driver ED1, and the second emission driver ED2 may be disposed in a left outside area of the active area A/A in the non-active area N/A, and a remaining part thereof may be disposed in a right outside area of the active area A/A in the non-active area N/A. In some embodiments, as illustrated in FIG. 1, the first scan driver SD1 and the first emission driver ED1 may be disposed in the left outside area of the active area A/A in the non-active area N/A, and the second scan driver SD2 and the second emission driver ED2 may be disposed in the right outside area of the active area A/A in the non-active area N/A.

In the scan driving circuit unit, the plurality of clock lines SCLK and ECLK disposed along one side surface of the active area A/A may be disposed in the direction parallel to the data line between the scan driver SD and the emission driver ED and between the emission driver ED and an edge of the substrate 110. Gate control lines connected to the scan driver SD may be disposed between the scan driver SD and the emission driver ED. The gate control lines may include a gate start pulse line, a scan clock line SCLK, a gate high voltage line, a gate low voltage line, and the like for driving the scan driver. FIG. 1 illustrates only the scan clock line SCLK among the gate control lines for convenience of illustration.

The emission control lines connected to the emission driver ED may be disposed between the emission driver ED and the edge of the substrate 110. The emission control lines may include an emission start pulse line, an emission clock line ECLK, an emission node reset voltage line, an emission driver high voltage line, an emission driver low voltage line, and the like for driving the emission driver. In FIG. 1, only the emission clock line ECLK is illustrated among the emission control lines for convenience of illustration.

Referring to FIG. 2, the touch electrodes 153 and connection portions 152 may be disposed in the active area A/A of the substrate 110. Accordingly, the active area A/A may also be referred to as a touch sensing area in which touch sensing is allowed. A plurality of the touch routing lines 154a and 154b and the sensing lines 154c for transmitting the touch driving signal to a touch sensing unit may be disposed in the non-active area A/A of the substrate 110.

The touch sensing unit is disposed on the substrate 110 and may include a plurality of the touch electrodes 153. In addition, the plurality of touch electrodes 153 may include a plurality of first touch electrodes 153a and a plurality of second touch electrodes 153b. The plurality of first touch electrodes 153a may be touch driving electrodes. In addition, the plurality of second touch electrodes 153b may be touch sensing electrodes. The plurality of first touch electrodes 153a may be connected in a row direction by first connection portions 152a to form a plurality of electrode rows, and the plurality of second touch electrodes 153b may be connected in a longitudinal direction by second connection portions 152b to form a plurality of electrode columns. Here, although it is illustrated that the plurality of first touch electrodes 153a and the plurality of second touch electrodes 153b are disposed in a form of 4×3, the present disclosure is not limited thereto. The plurality of first touch electrodes 153a may receive a touch driving signal, and the plurality of second touch electrodes 153b may transmit a touch sensing signal in response to the touch driving signal. The plurality of first touch electrodes 153a and the plurality of second touch electrodes 153b may be formed on the same layer. However, the present disclosure is not limited thereto.

The first connection portion 152a may allow one first touch electrode 153a to be connected to a first touch electrode 153a. Also, the second connection portion 152b may allow one second touch electrode 153b to be connected to a second touch electrode 153b. The first connection portion 152a and the second connection portion 152b may be disposed to cross each other with an insulating layer therebetween. For example, when the plurality of first touch electrodes 153a and the plurality of second touch electrodes 153b are disposed on the same layer, the first connection portions 152a connecting the plurality of first touch electrodes 153a may be formed on a layer different from the plurality of first touch electrodes 153a and the plurality of second touch electrodes 153b so that the plurality of first touch electrodes 153a and the plurality of second touch electrodes 153b are not directly connected. Accordingly, the first connection portions 152a may be referred to as connection electrodes.

In addition, the first connection portion 152a may be connected to the plurality of first touch electrodes 153a through a contact hole. In addition, the second connection portion 152b connecting the plurality of second touch electrodes 153b may be disposed on the same layer as the plurality of first touch electrodes 153a and the plurality of second touch electrodes 153b. The second connection portion 152b may be formed as an integrated body that is connected to the plurality of second touch electrodes 153b. Accordingly, an insulating layer may be disposed between the first connection portion 152a connecting the plurality of first touch electrodes 153a and the second connection portion 152b connecting the plurality of second touch electrodes 153b.

In addition, the plurality of first touch electrodes 153a and the plurality of second touch electrodes 153b may be formed by patterning a conductive metal layer. In addition, the plurality of first touch electrodes 153a and the plurality of second touch electrodes 153b may be formed of a transparent material such as indium tin oxide (ITO). In addition, the plurality of first touch electrodes 153a and the plurality of second touch electrodes 153b that are patterned may include electrode patterns formed in a mesh shape, and the plurality of first touch electrodes 153a and the plurality of second touch electrodes 153b may include a plurality of openings. Light that is emitted from the display device 100 may be emitted to the outside by passing through the plurality of first touch electrodes 153a and the plurality of second touch electrodes 153b. However, the present disclosure is not limited thereto, and light emitted from the display device 100 may be emitted to the outside through a plurality of openings included in the plurality of first touch electrodes 153a and the plurality of second touch electrodes 153b.

The patterns of the plurality of first touch electrodes 153a and the plurality of second touch electrodes 153b formed in a mesh shape may be referred to as touch electrode lines. In addition, the plurality of first touch electrodes 153a may be connected to the plurality of touch routing lines 154a and 154b so that a driving signal to be driven is applied to the touch electrodes 153. In addition, the plurality of second touch electrodes 153b may be connected to a plurality of the sensing lines 154c through which a sensing signal generated in response to a touch sensed by the touch electrode 153 is transmitted. In some embodiments, the plurality of touch routing lines 154a and 154b may be RX touch routing lines. In some embodiments, the plurality of first touch electrodes 153a connected to the plurality of touch routing lines 154a and 154b may be RX touch electrodes.

The touch sensing unit including the touch electrodes 153 and the connection portions 152 is disposed in the active area A/A of the substrate 110, and the plurality of touch routing lines 154a and 154b, the plurality of sensing lines 154c, the scan drivers SD, the emission drivers ED, and the plurality of clock lines SCLK and ECLK may be disposed in the non-active area N/A of the substrate 110.

The plurality of touch routing lines 154a and 154b are connected to the plurality of first touch electrodes 153a, may extend in the row direction along a direction in which the plurality of first touch electrodes 153a are arranged, may be bent so as not to overlap a remaining portion of the touch routing lines 154a and 154b, and may extend in the direction parallel to the data line of the active area A/A. However, a line shape of the plurality of touch routing lines 154a and 154b is not limited thereto. Accordingly, the plurality of touch routing lines 154a and 154b may be disposed to overlap some regions of the scan driver SD, the emission driver ED, the scan clock line SCLK and the emission clock line ECLK of the non-active area A/A.

Figure 3:
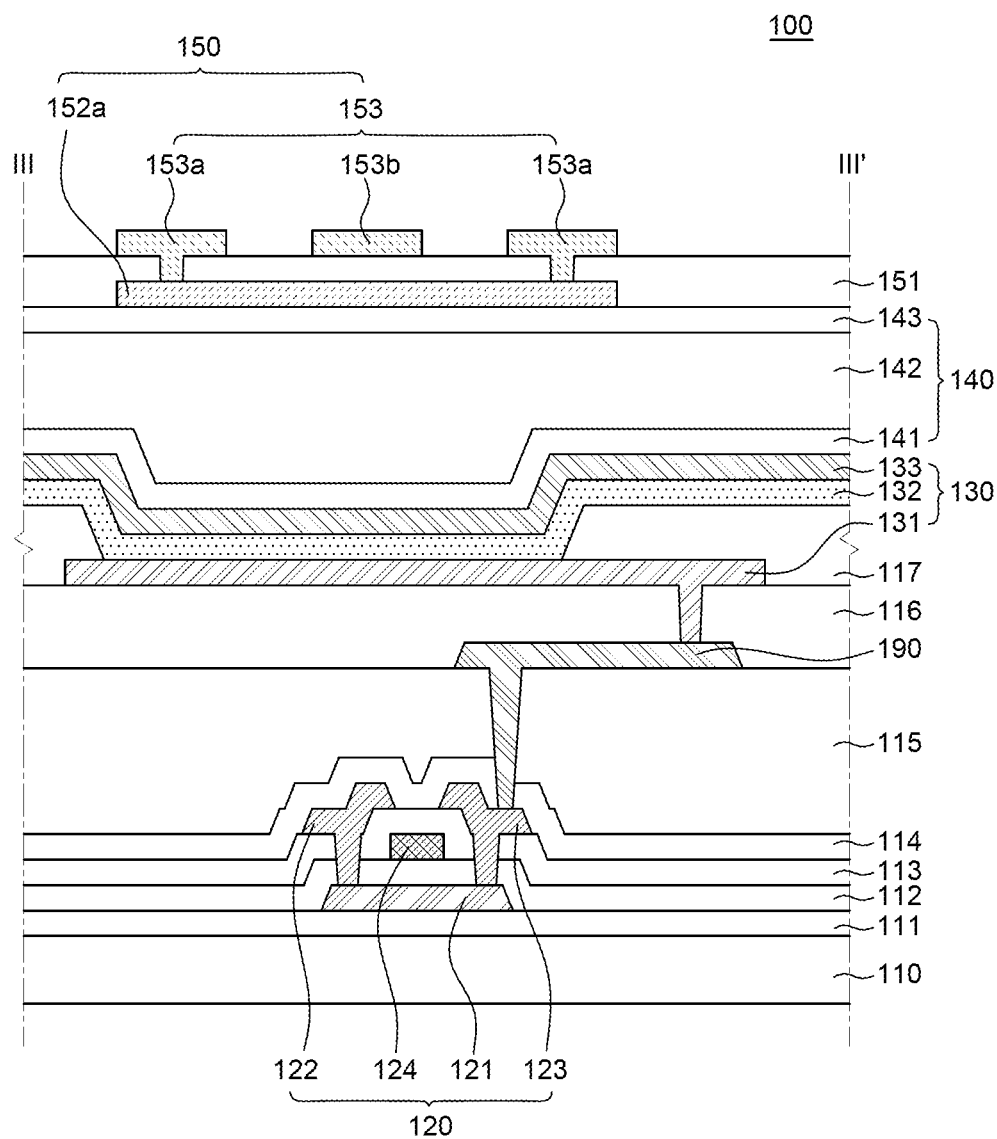
FIG. 3 is a cross-sectional view taken along line III-III' of FIG. 1.

FIG. 3 is a cross-sectional view taken along line of FIG. 1.

Referring to FIG. 3, the display device 100 according to an example embodiment of the present disclosure may include the substrate 110, a buffer layer 111, a thin film transistor 120, a gate insulating layer 112, an interlayer insulating layer 113, a passivation layer 114, a first planarization layer 115, a connection electrode 190, a second planarization layer 116, a bank 117, a light emitting element 130, an encapsulation unit 140, a touch insulating layer 151, and a touch sensing unit 150.

The substrate 110 may support various components of the display device 100. The substrate 110 may be formed of glass or a plastic material having flexibility. When the substrate 110 is formed of a plastic material, it may be formed of, for example, polyimide (PI).

The buffer layer 111 may be disposed on the substrate 110. The buffer layer 111 may be formed of a single layer of silicon nitride (SiNx) or silicon oxide (SiOx) or multiple layers thereof. The buffer layer 111 may improve adhesion between layers formed on the buffer layer 111 and the substrate 110, and may serve to block alkali components or the like leaking from the substrate 110.

The thin film transistor 120 may be disposed on the buffer layer 111. The thin film transistor 120 may include an active layer 121, a gate electrode 124, a source electrode 122, and a drain electrode 123. Here, depending on a design of a pixel circuit, the source electrode 122 may be a drain electrode, and the drain electrode 123 may be a source electrode. The active layer 121 of the thin film transistor 120 may be disposed on the buffer layer 111.

The active layer 121 may be formed of various materials such as polysilicon, amorphous silicon, an oxide semiconductor or the like. The active layer 121 may include a channel region in which a channel is formed when the thin film transistor 120 is driven, and a source region and a drain region on both sides of the channel region. The source region refers to a portion of the active layer 121 connected to the source electrode 122, and the drain region refers to a portion of the active layer 121 connected to the drain electrode 123.

The gate insulating layer 112 may be disposed on the active layer 121 of the thin film transistor 120. The gate insulating layer 112 may be formed of a single layer of silicon nitride (SiNx) or silicon oxide (SiOx) or multiple layers thereof. The gate insulating layer 112 may be formed to have contact holes through which the source electrode 122 and the drain electrode 123 of the thin film transistor 120 are connected to the source region and the drain region of the active layer 121 of the thin film transistor 120, respectively.

The gate electrode 124 of the thin film transistor 120 may be disposed on the gate insulating layer 112. The gate electrode 124 may be formed of a single layer or multiple layers of any one of molybdenum (Mo), copper (Cu), titanium (Ti), aluminum (Al), chromium (Cr), gold (Au), nickel (Ni), and neodymium (Nd) or an alloy of them. The gate electrode 124 may be formed on the gate insulating layer 112 to overlap the channel region of the active layer 121 of the thin film transistor 120.

The interlayer insulating layer 113 may be disposed on the gate insulating layer 112 and the gate electrode 124. The interlayer insulating layer 113 may be formed of a single layer of silicon nitride (SiNx) or silicon oxide (SiOx) or multiple layers thereof. Contact holes for exposing the source region and the drain region of the active layer 121 of the thin film transistor 120 may be formed in the interlayer insulating layer 113.

The source electrode 122 and the drain electrode 123 of the thin film transistor 120 may be disposed on the interlayer insulating layer 113.

The source electrode 122 and the drain electrode 123 of the thin film transistor 120 may be connected to the active layer 121 of the thin film transistor 120 through the contact holes formed in the gate insulating layer 112 and the interlayer insulating layer 113. Accordingly, the source electrode 122 of the thin film transistor 120 may be connected to the source region of the active layer 121 through the contact holes formed in the gate insulating layer 112 and the interlayer insulating layer 113. In addition, the drain electrode 123 of the thin film transistor 120 may be connected to the drain region of the active layer 121 through the contact holes formed in the gate insulating layer 112 and the interlayer insulating layer 113.

The source electrode 122 and the drain electrode 123 of the thin film transistor 120 may be formed by the same process. In addition, the source electrode 122 and the drain electrode 123 of the thin film transistor 120 may be formed of the same material. The source electrode 122 and the drain electrode 123 of the thin film transistor 120 may be formed of a single layer or multiple layers of any one of molybdenum (Mo), copper (Cu), titanium (Ti), aluminum (Al), chromium (Cr), gold (Au), nickel (Ni), and neodymium (Nd) or an alloy of them.

The passivation layer 114 for protecting the source electrode 122 and the drain electrode 123 may be disposed on the source electrode 122 and the drain electrode 123. The passivation layer 114 is an insulating layer for protecting components under the passivation layer 114. For example, the passivation layer 114 may be formed of a single layer of silicon oxide (SiOx) or silicon nitride (SiNx) or multiple layers thereof, but is not limited thereto. Also, the passivation layer 114 may be omitted according to example embodiments.

The first planarization layer 115 may be disposed on the thin film transistor 120 and the passivation layer 114. As illustrated in FIG. 3, a contact hole for exposing the drain electrode 123 may be formed in the first planarization layer 115. The first planarization layer 115 may be an organic material layer for planarizing an upper portion of the thin film transistor 120. For example, the first planarization layer 115 may be formed of an organic material such as an acrylic resin, an epoxy resin, a phenolic resin, a polyamide resin, a polyimide resin, or the like. However, the present disclosure is not limited thereto, and the first planarization layer 115 may be an inorganic material layer for protecting the thin film transistor 120. For example, it may be formed of an inorganic material such as silicon nitride (SiNx) or silicon oxide (SiOx). The first planarization layer 115 may be formed of a single layer of silicon nitride (SiNx) or silicon oxide (SiOx) or multiple layers thereof.

The connection electrode 190 may be disposed on the first planarization layer 115. In addition, the connection electrode 190 may be connected to the drain electrode 123 of the thin film transistor 120 through the contact hole of the first planarization layer 115. The connection electrode 190 may serve to electrically connect the thin film transistor 120 and the light emitting element 130. For example, the connection electrode 190 may serve to electrically connect the drain electrode 123 of the thin film transistor 120 and a first electrode 131 of the light emitting element 130. The connection electrode 190 may be formed of a single layer or multiple layers of any one of molybdenum (Mo), copper (Cu), titanium (Ti), aluminum (Al), chromium (Cr), gold (Au), nickel (Ni), and neodymium (Nd) or an alloy of them. The connection electrode 190 may be formed of the same material as the source electrode 122 and the drain electrode 123 of the thin film transistor 120.

The second planarization layer 116 may be disposed on the connection electrode 190 and the first planarization layer 115. And, as illustrated in FIG. 3, a contact hole for exposing the connection electrode 190 may be formed in the second planarization layer 116. The second planarization layer 116 may be an organic material layer for planarizing the upper portion of the thin film transistor 120. For example, the second planarization layer 116 may be formed of an organic material such as an acrylic resin, an epoxy resin, a phenolic resin, a polyamide resin, a polyimide resin or the like.

The light emitting element 130 may be disposed on the second planarization layer 116. The light emitting element 130 may include a first electrode 131, a light emitting structure 132, and a second electrode 133. The first electrode 131 of the light emitting element 130 may be disposed on the second planarization layer 116. The first electrode 131 may be electrically connected to the connection electrode 190 through the contact hole formed in the second planarization layer 116. Accordingly, the first electrode 131 of the light emitting element 130 may be electrically connected to the thin film transistor 120 by being connected to the connection electrode 190 through the contact hole formed in the second planarization layer 116.

The first electrode 131 may be formed in a multilayer structure including a transparent conductive layer and an opaque conductive layer having high reflective efficiency. The transparent conductive layer may be formed of a material having a relatively large work function value, such as indium-tin-oxide (ITO) or indium-zinc-oxide (IZO). In addition, the opaque conductive layer may have a single-layer or multilayer structure including aluminum (Al), silver (Ag), copper (Cu), lead (Pb), molybdenum (Mo), titanium (Ti), or an alloy thereof. For example, the first electrode 131 may be formed in a structure in which a transparent conductive layer, an opaque conductive layer, and a transparent conductive layer are sequentially stacked. However, the present disclosure is not limited thereto, and it may be formed in a structure in which a transparent conductive layer and an opaque conductive layer are sequentially stacked.

Since the display device 100 according to an example embodiment of the present disclosure is a top emission type display device, the first electrode 131 may be an anode electrode. When the display device 100 is a bottom emission type, the first electrode 131 disposed on the second planarization layer 116 may be a cathode electrode.

The bank 117 may be disposed on the first electrode 131 and the second planarization layer 116. An opening for exposing the first electrode 131 may be formed in the bank 117. The bank 117 may define an emission area of the display device 100 and thus may be referred to as a pixel defining layer.

The light emitting structure 132 including a light emitting layer may be disposed on the first electrode 131.

The light emitting structure 132 of the light emitting element 130 may be formed by stacking a hole layer, the light emitting layer, and an electron layer on the first electrode 131 in an order or in a reverse order. In addition to this, the light emitting structure 132 may include a first light emitting structure and a second light emitting structure that face each other with a charge generating layer interposed therebetween. In some embodiments, the light emitting layer of any one of the first and second light emitting structures generates blue light, and the light emitting layer of the other one of the first and second light emitting structures generates yellow-green light, so that white light may be generated through the first and second light emitting structures. White light that is generated from the light emitting structure 132 may be incident on a color filter positioned at an upper portion of the light emitting structure 132 and implement a color image. In addition to this, a color image may be implemented by generating color light corresponding to each sub-pixel in each light emitting structure 132 without a separate color filter. For example, the light emitting structure 132 of a red sub-pixel may generate red light, the light emitting structure 132 of a green sub-pixel may generate green light, and the light emitting structure 132 of a blue sub-pixel may generate blue light.

The second electrode 133 may be further disposed on the light emitting structure 132. The second electrode 133 of the light emitting element 130 may be disposed on the light emitting structure 132 to face the first electrode 131 with the light emitting structure 132 interposed therebetween. In the display device 100 according to an example embodiment of the present disclosure, the second electrode 133 may be a cathode electrode. The encapsulation unit 140 for suppressing moisture penetration may be further disposed on the second electrode 133.

The encapsulation unit 140 may include a first inorganic encapsulation layer 141, an organic encapsulation layer 142, and a second inorganic encapsulation layer 143. The first inorganic encapsulation layer 141 of the encapsulation unit 140 may be disposed on the second electrode 133. In addition, the organic encapsulation layer 142 may be disposed on the first inorganic encapsulation layer 141. Also, the second inorganic encapsulation layer 143 may be disposed on the organic encapsulation layer 142. The first inorganic encapsulation layer 141 and the second inorganic encapsulation layer 143 of the encapsulation unit 140 may be formed of an inorganic material such as silicon nitride (SiNx) or silicon oxide (SiOx). The organic encapsulation layer 142 of the encapsulation unit 140 may be formed of an organic material such as an acrylic resin, an epoxy resin, a phenolic resin, a polyamide resin, a polyimide resin, or the like.

The touch sensing unit 150 may be disposed on the second inorganic encapsulation layer 143 of the encapsulation unit 140. The touch sensing unit 150 may include the touch electrodes 153 and the connection portions 152.

The connection portions 152 of the touch sensing unit 150 may be disposed on the second inorganic encapsulation layer 143. For example, the first connection portion 152a of the connection portions 152 may be disposed on the second inorganic encapsulation layer 143. The first connection portion 152a may be formed of a single layer or multiple layers of any one of molybdenum (Mo), copper (Cu), titanium (Ti), aluminum (Al), chromium (Cr), gold (Au), nickel (Ni), and neodymium (Nd) or an alloy of them. However, the present disclosure is not limited thereto, and may be formed of a transparent conductive layer such as indium-tin-oxide (ITO) or indium-zinc-oxide (IZO). A lower surface of the first connection portion 152a of the connection portions 152 may directly contact an upper surface of the encapsulation unit 140. For example, the lower surface of the first connection portion 152a may directly contact the second inorganic encapsulation layer 143 of the encapsulation unit 140.

The touch insulating layer 151 may be disposed on the encapsulation unit 140 and the first connection portion 152a. For example, the touch insulating layer 151 may be disposed on the first connection portion 152a and the second inorganic encapsulation layer 143 of the encapsulation unit 140. In addition, the touch insulating layer 151 may be formed of an inorganic material layer or an organic material layer. When the touch insulating layer 151 is an inorganic material layer, the touch insulating layer 151 may be formed of a single layer of silicon nitride (SiNx) or silicon oxide (SiOx) or multiple layers thereof. And, when the touch insulating layer 151 is an organic material layer, it may be formed of an organic material such as an acrylic resin, an epoxy resin, a phenolic resin, a polyamide resin, a polyimide resin or the like. Contact holes for exposing the first connection portion 152a may be formed in the touch insulating layer 151.

The plurality of first touch electrodes 153a and the plurality of second touch electrodes 153b of the touch electrodes 153 may be disposed on the touch insulating layer 151. In addition, although not illustrated in the drawings, the second connection portions 152b may also be disposed on the touch insulating layer 151. In addition, the second connection portions 152b may connect the plurality of second touch electrodes 153b to each other. The second connection portions 152b may be disposed on the same layer as the plurality of first touch electrodes 153a and the plurality of second touch electrodes 153b.

The plurality of first touch electrodes 153a may be connected to the first connection portion 152a through the contact holes of the touch insulating layer 151. The plurality of first touch electrodes 153a may be connected to each other by the first connection portion 152a.

The first touch electrode 153a and the second touch electrode 153b of the touch electrode 153 may be formed of a transparent conductive layer such as indium-tin-oxide (ITO) or indium-zinc-oxide (IZO). However, the present disclosure is not limited thereto, and the first touch electrode 153a and the second touch electrode 153b may be formed of an opaque conductive layer having an opening. When the first touch electrode 153a and the second touch electrode 153b are formed of an opaque conductive layer having an opening, it may be formed of a single layer or multiple layers of any one of molybdenum (Mo), copper (Cu), titanium (Ti), aluminum (Al), chromium (Cr), gold (Au), nickel (Ni), and neodymium (Nd) or an alloy of them.

Figure 4:
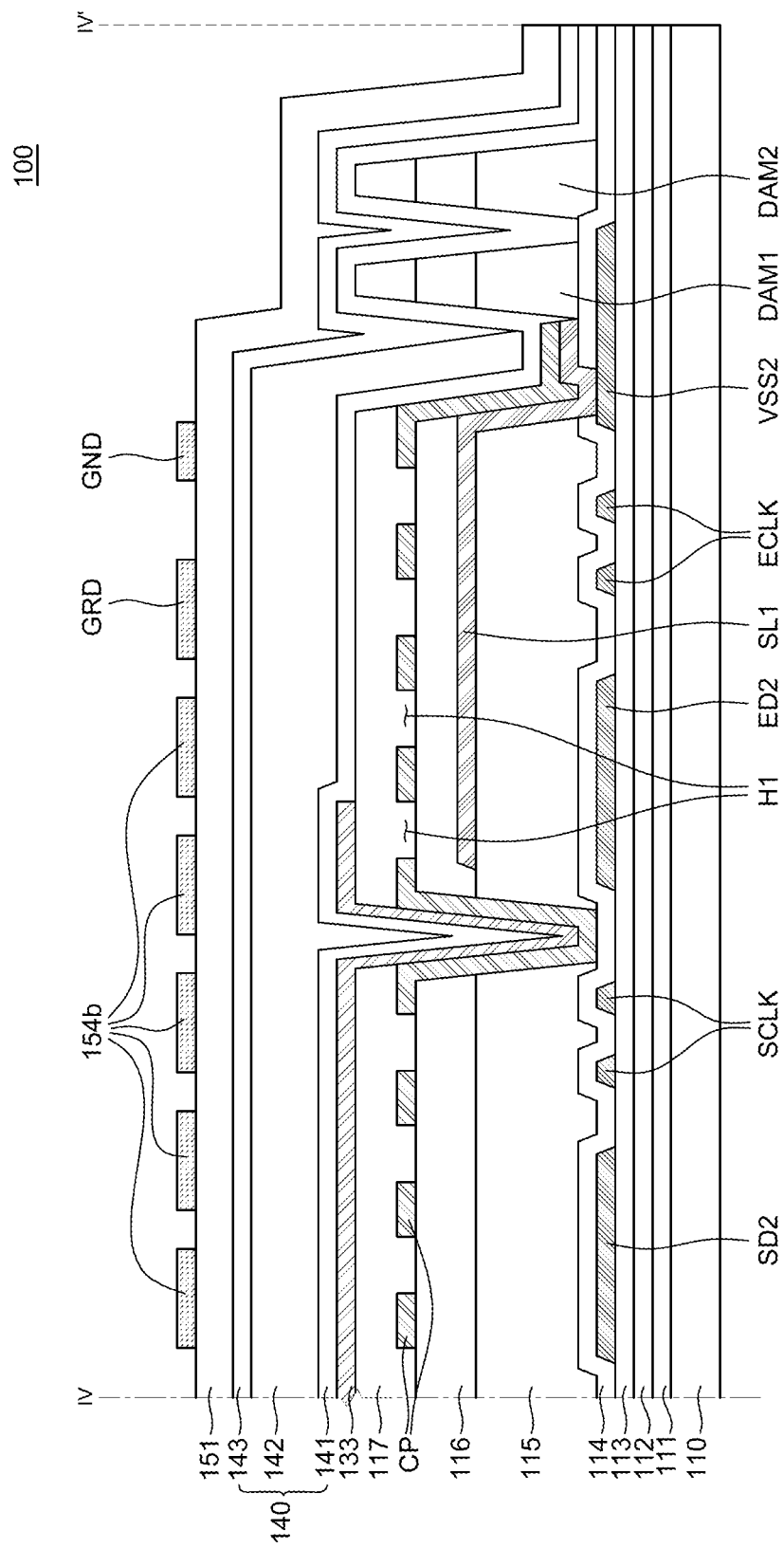
FIG. 4 is a cross-sectional view taken along line IV-IV' of FIG. 1.
Figure 5:
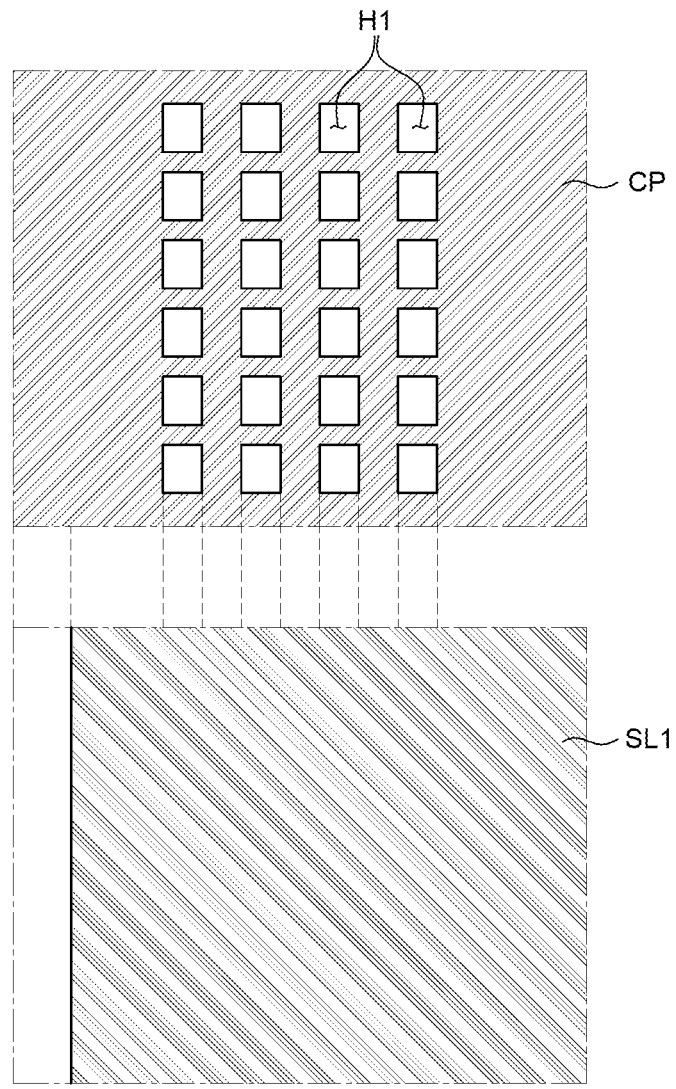
FIG. 5 is a plan view illustrating a connection pattern and a shielding layer of the display device according to an example embodiment of the present disclosure.

FIG. 4 is a cross-sectional view taken along line IV-IV' of FIG. 1. FIG. 5 is a plan view illustrating a connection pattern and a shielding layer of the display device according to an example embodiment of the present disclosure. FIG. 5 illustrates only a connection pattern CP and a shielding layer SL1 among various components of the display device 100 for convenience of illustration.

First, referring to FIG. 4, the second scan driver SD2, the scan clock lines SCLK, the second emission driver ED2 and the emission clock lines ECLK, a second low potential power line VSS2, the shielding layer SL1, the connection pattern CP, the second electrode 133, and the plurality of touch routing lines 154b may be disposed in an non-active area outside the active area AA, e.g., the right outside area of the active area A/A in the non-active area N/A as shown in FIG. 4 as an example.

At this time, the second scan driver SD2, the scan clock line SCLK, the second emission driver ED2, the emission clock line ECLK, and the second low potential power line VSS2 are disposed between the interlayer insulating layer 113 and the passivation layers 114. The second scan driver SD2, the scan clock line SCLK, the second emission driver ED2, the emission clock line ECLK and the second low potential power line VSS2 may be formed of the same material by the same process as the source electrode 122 and the drain electrode 123 disposed between the interlayer insulating layer 113 and the passivation layer 114 of the active area A/A. However, the present disclosure is not limited thereto, and the second scan driver SD2, the scan clock line SCLK, the second emission driver ED2, the emission clock line ECLK, and the second low potential power line VSS2 may be formed of the same material by the same process as an conductive electrode or line disposed on a different layer.

Referring to FIG. 4, the second emission driver ED2 and the plurality of emission clock lines ECLK are disposed in the non-active area N/A. The second low potential power line VSS2 may be disposed more outwardly than the plurality of emission clock lines ECLK. However, embodiments of the present disclosure is not limited thereto. For example, the second low potential power line VSS2 may be disposed between the second emission driver ED2 and the plurality of scan clock lines SCLK. In addition, the second scan driver SD2 and the plurality of scan clock lines SCLK are disposed between the active area A/A and the second emission driver ED2.

The shielding layer SL1 is disposed between the first planarization layer 115 and the second planarization layer 116. The shielding layer SL1 may be formed of the same material by the same process as the connection electrode 190 disposed between the first planarization layer 115 and the second planarization layer 116 of the active area A/A. In some embodiments, the shielding layer SL1 may be formed by the same process as the connection electrode 190. Referring to FIGS. 4 and 5, the shielding layer SL1 may have a single-layer structure, and the shielding layer SL1 may not have a separate hole.

Referring to FIG. 4, the shielding layer SL1 may be disposed vertically between the second emission driver ED2 and the plurality of emission clock lines ECLK and the connection pattern CP to be described later. In some embodiments, one end of the shielding layer SL1 may overlap the second emission driver ED2, and the other end thereof may be in contact with the second low potential power line VSS2. For example, the shielding layer SL1 may be disposed on the second low potential power line VSS2 at an outer portion of the first planarization layer 115 and be electrically connected to the second low potential power line VSS2. Accordingly, a low potential power, e.g., a constant voltage, may be transmitted to the shielding layer SL1.

The connection pattern CP may be disposed on the second planarization layer 116. The connection pattern CP may be formed of the same material as the first electrode 131 of the light emitting element 130 and may be disposed on the same layer as the first electrode 131. For example, the connection pattern CP may be formed by the same process as the first electrode 131.

The connection pattern CP may be electrically connected to the second low potential power line VSS2 through the shielding layer SL1 at an outer portion of the second planarization layer 116. For example, the connection pattern CP contacts the shielding layer SL1 that is in contact with the second low potential power line VSS2 at the outer portion of the second planarization layer 116 and may be electrically connected to the second low potential power line VSS2.

Referring to FIGS. 4 and 5, the connection pattern CP may include a plurality of first holes H1. In some embodiments, the connection pattern CP has the plurality of first holes H1 and a mesh structure surrounding the plurality of first holes H1. Accordingly, the plurality of first holes H1 of the connection pattern CP may function to discharge gases such as hydrogen ($H_2$) and the like that may be generated in the first planarization layer 115 or the second planarization layer 116. For example, the holes H1 may function for outgassing.

The bank 117 may be disposed on the connection pattern CP, and the second electrode 133, i.e., a cathode electrode, may be disposed on the bank 117 in the same manner as the active area A/A. The second electrode 133 may be disposed on only a partial region of an upper surface of the bank 117 disposed on the shielding layer SL1. For example, the second electrode 133 may not cover an area that is adjacent to an outermost portion of the upper surface of the bank 117. Accordingly, the second electrode 133 may not overlap an entirety of the plurality of touch routing lines 154b.

The first inorganic encapsulation layer 141, the organic encapsulation layer 142, and the second inorganic encapsulation layer 143 of the encapsulation unit 140 may be disposed on the second electrode 133 and the bank 117. In addition, the touch insulating layer 151 may be disposed on the second inorganic encapsulation layer 143 of the encapsulation unit 140.

Dam portions DAM1 and DAM2 may be disposed on an outermost portion of the non-active area N/A. The dam portions DAM1 and DAM2 may be disposed in the non-active area N/A and block a flow of the organic encapsulation layer 142 constituting the encapsulation unit 140. The dam portions DAM1 and DAM2 are configured to have a predetermined threshold height or higher than a threshold height to block the flow of the organic encapsulation layer 142. In some embodiments, the dam portions DAM1 and DAM2 may be formed of at least one or more layers formed of an organic material. For example, the dam portions DAM1 and DAM2 may have a multilayer structure formed of the same material as the first planarization layer 115, the second planarization layer 116, and the bank 117 as illustrated in FIG. 4, but are not limited thereto.

The plurality of touch electrodes 153 are disposed on the touch insulating layer 151 in the active area A/A, and the plurality of touch routing lines 154b may be disposed in the non-active area N/A. Also, a ground line GND may be disposed between the plurality of touch routing lines 154b and an edge region of the substrate 110. The ground line GND is a line that functions to discharge static electricity generated in the display device 100 to a ground. The ground line GND may be disposed at an outermost portion of the lines formed in the same layer as the plurality of touch electrodes 153 in the non-active area N/A. A guard line GRD may be disposed between the ground line GND and the plurality of touch routing lines 154b. The guard line GRD is a line that functions to block noise coming into the plurality of touch routing lines 154b from the outside and to compensate for signals of the plurality of touch routing lines 154b. The guard line GRD may be formed in the same layer as the plurality of touch electrodes 153 like the plurality of touch routing lines 154b and the ground line GND in the non-active area N/A.

Inventor recognized that in a display device, when driving signals generated from emission drivers and emission clock lines are introduced into touch routing lines, the driving signal acts as noise. That is, interference between a touch sensing signal and the driving signal that is generated in the emission driver and the emission clock line may occur, thereby causing confusion in the touch routing line, which leads to a touch noise defect in a touch sensing unit.

The driving signal generated from the emission driver and the emission clock line may be partially shielded by a connection pattern and a second electrode that are disposed on the emission driver and the emission clock line. However, since the connection pattern formed of the same material as an anode electrode includes a plurality of holes for discharging gases such as hydrogen and the like that may be generated in a planarization layer, the driving signal can pass through the connection pattern through the plurality of holes. Also, in the case of the second electrode, e.g., a cathode electrode, it may extend only to a partial area of the non-active area and may be disconnected due to a design margin.

For example, as a deposition process of the second electrode, a process method of performing an entire surface deposition is utilized by using an open mask without performing a photo-process and an etching process for forming a pattern. Thus, an end of the second electrode in the non-active area has a large process tolerance and may not be covered up to a desired location. Therefore, if the second electrode is not sufficiently deposited to overlap up to a touch routing line disposed at an outermost portion among a plurality of touch routing lines, it fails to perform a role of shielding between the touch routing line and the emission clock line, so there is a defect in which the driving signal generated from the emission clock line and the emission driver reaches the touch routing line. That is, due to a design margin of the second electrode, there may be a defect in which the driving signal is introduced into the touch routing line and causes poor touch noise.

In the display device 100 according to an example embodiment of the present disclosure, the shielding layer SL1 through or to which a low potential power, which is a constant voltage, is transmitted or applied is disposed in an area that may not be covered by the second electrode 133, so that the shielding layer SL1 may be configured to shield signal noise between the touch routing lines 154a and 154b and the emission clock line ECLK. Accordingly, in the display device 100 according to an example embodiment of the present disclosure, the shielding layer SL1 through or to which a low potential power is transmitted or applied is disposed in the non-active area N/A, so that a phenomenon in which interference between the driving signal and the touch signal occurs can be minimized or reduced.

In some embodiments, in the display device 100 according to an example embodiment of the present disclosure, since the shielding layer SL1 is formed as a single layer, even noise that may be introduced into the plurality of first holes H1 of the connection pattern CP can be completely blocked. As described above, the connection pattern CP may have a mesh structure including the plurality of first holes H1 for discharging gases such as hydrogen ($H_2$) and the like. Accordingly, signals may pass through the plurality of first holes H1 of the connection pattern CP, thereby causing interference between the driving signal and the touch signal. Accordingly, in the display device 100 according to an example embodiment of the present disclosure, the shielding layer SL1 has a single-layer structure overlapping the plurality of first holes H1 and the mesh structure of the connection pattern CP, and does not have a separate hole, so that even noise that may be introduced into the plurality of first holes H1 of the connection pattern CP may be blocked. Accordingly, in the display device 100 according to an example embodiment of the present disclosure, since a signal-to-noise ratio of the touch signal is increased and interference between signals does not occur, so that a more stable touch sensing system in which accuracy of touch sensing can be increased, and touch sensitivity can be improved may be provided.

Figure 6:
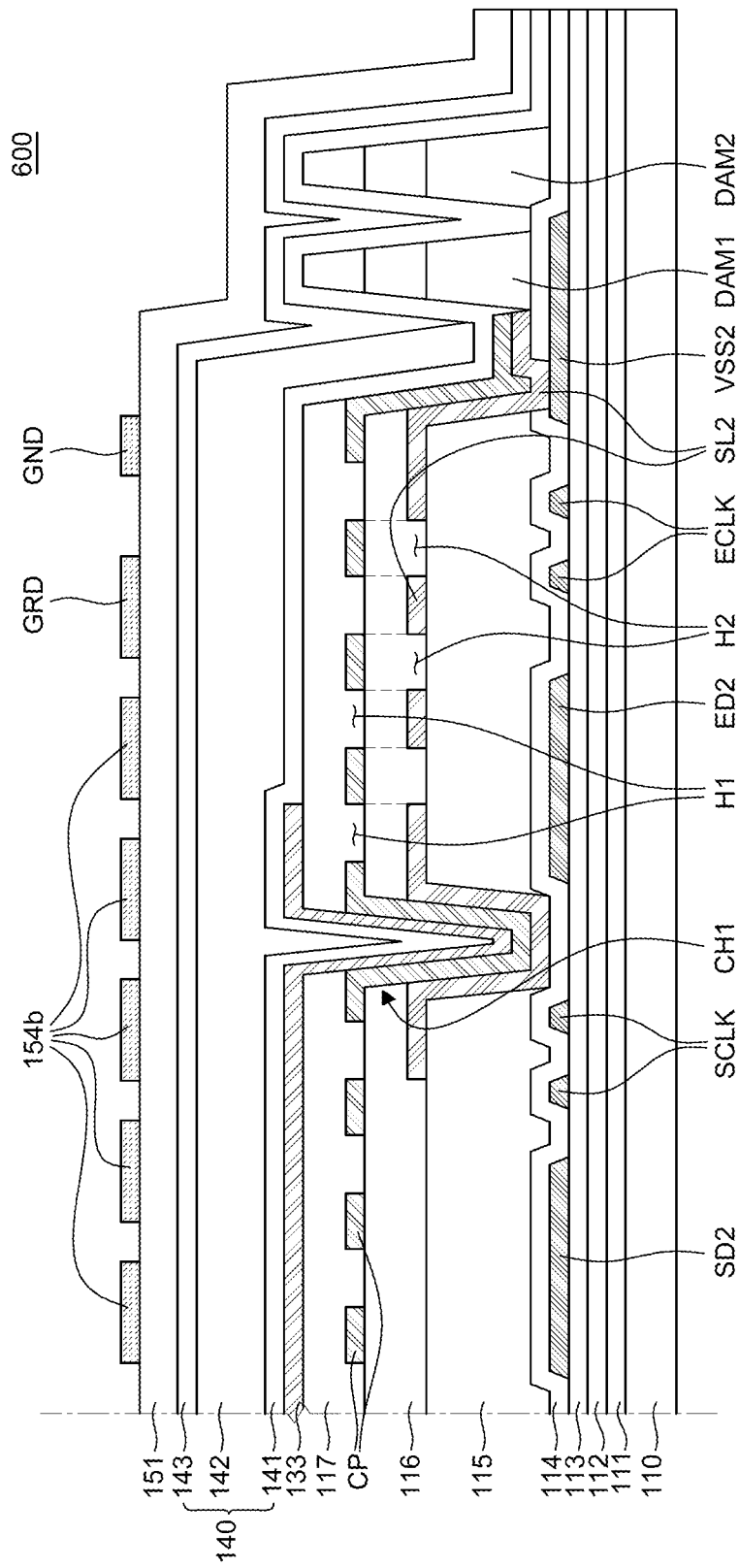
FIG. 6 is a cross-sectional view of a display device according to an example embodiment of the present disclosure.
Figure 7:
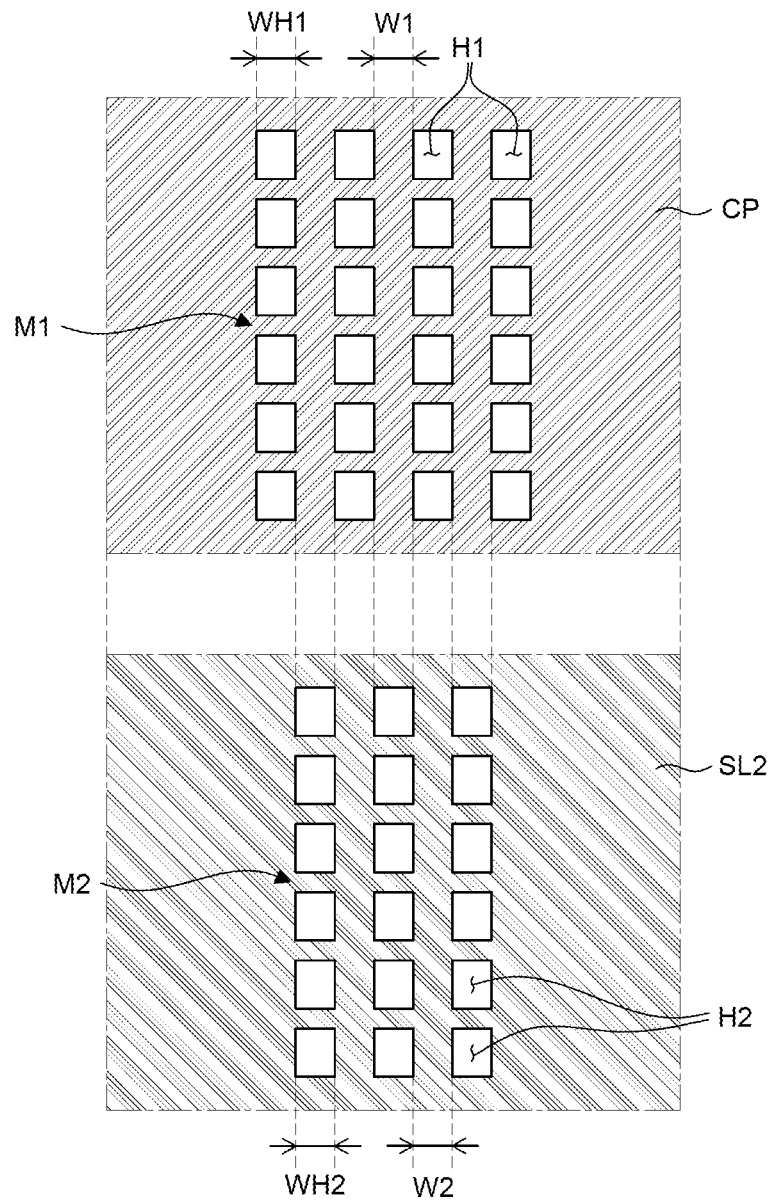
FIG. 7 is a plan view illustrating a connection pattern and a shielding layer of a display device according to an example embodiment of the present disclosure.

FIG. 6 is a cross-sectional view of a display device according to an example embodiment of the present disclosure. FIG. 7 is a plan view illustrating a connection pattern and a shielding layer of a display device according to an example embodiment of the present disclosure. A display device 600 of FIGS. 6 and 7 is different from the display device 100 of FIGS. 1 to 5 only in terms of a shielding layer SL2, and other configurations thereof are substantially the same. Thus, a redundant description will be omitted.

Referring to FIG. 6, the shielding layer SL2 is disposed between the first planarization layer 115 and the second planarization layer 116. The shielding layer SL2 is formed of the same material as the connection electrode 190 disposed between the first planarization layer 115 and the second planarization layer 116 of the active area A/A, and may be disposed on the same layer as the connection electrode 190. In some embodiments, the shielding layer SL2 may be formed by the same process as the connection electrode 190.

In some embodiments, the shielding layer SL2 may extend from an upper portion of the second low potential power line VSS2, over the second emission driver ED2 and the plurality of emission clock lines ECLK to an area between the plurality of scan clock lines SCLK and the second emission driver ED2. The shielding layer SL2 may overlap a portion of the plurality of scan clock lines SCLK, the second emission driver ED2, and the plurality of emission clock lines ECLK.

The shielding layer SL2 may be disposed, vertically, between the second emission driver ED2 and the plurality of emission clock lines ECLK, and the connection pattern CP. In some embodiments, one end of the shielding layer SL2 may overlap a portion of the plurality of scan clock lines SCLK, and the other end thereof may be in contact with the second low potential power line VSS2. For example, the shielding layer SL2 may be disposed on the second low potential power line VSS2 at an outer portion of the first planarization layer 115 and be electrically connected to the second low potential power line VSS2. Accordingly, a low potential power, e.g., a constant voltage, may be transmitted to the shielding layer SL2.

The connection pattern CP may be disposed on the second planarization layer 116. The connection pattern CP may be formed of the same material as the first electrode 131 of the light emitting element 130 and may be disposed on the same layer as the first electrode 131. In some embodiments, the connection pattern CP may be formed by the same process as the first electrode 131.

The connection pattern CP may be electrically connected to the second low potential power line VSS2 through the shielding layer SL2 at an outer portion of the second planarization layer 116. In some embodiments, the connection pattern CP contacts the shielding layer SL2 that is in contact with the second low potential power line VSS2 at the outer portion of the second planarization layer 116 and may be electrically connected to the second low potential power line VSS2. Also, a portion of the connection pattern CP may be in contact with the shielding layer SL2 disposed in an area between the plurality of scan clock lines SCLK and the second emission driver ED2. In some embodiments, a portion of the connection pattern CP may be connected to the shielding layer SL2 that is exposed through a first contact hole CH1 formed in the second planarization layer 116 in a manner in contact with the shielding layer SL2, and may be electrically connected to the second low potential power line VSS2 through the shielding layer SL2. In some embodiments, the first contact hole CH1 extend into the first planarization layer 115. In some embodiments, the second shielding layer SL2 is in contact with the passivation layer 114 through the first contact hole CH1. In some embodiments, the first contact hole CH1 also extends through the bank 117, and the second electrode 133 is in contact with the connection pattern CP in the first contact hole CH1. In some embodiments, the second electrode 133, the connection pattern CP and the second shielding layer SL2 are all in the first contact hole CH1.

Referring to FIGS. 6 and 7, the connection pattern CP may include a plurality of first holes H1. In some embodiments, the connection pattern CP has the plurality of first holes H1 and a first mesh structure M1 surrounding the plurality of first holes H1. Accordingly, the plurality of first holes H1 of the connection pattern CP may function to discharge gases such as hydrogen ($H_2$) and the like that may be generated in the first planarization layer 115 or the second planarization layer 116, that is, may function for outgassing.

In some embodiments, the shielding layer SL2 may have a plurality of second holes H2 overlapping the mesh structure M1 of the connection pattern CP. In some embodiments, the shielding layer SL2 has the plurality of second holes H2 overlapping the mesh structure M1 of the connection pattern CP and a mesh structure M2 surrounding the plurality of second holes H2. The plurality of first holes H1 of the connection pattern CP and the plurality of second holes H2 of the shielding layer SL2 may function to discharge gases such as hydrogen ($H_2$) and the like that may be generated in the first planarization layer 115 or the second planarization layer 116. For example, second holes H2 may function for outgassing.

The plurality of second holes H2 of the shielding layer SL2 may overlap the mesh structure M1 of the connection pattern CP, and the plurality of first holes H1 of the connection pattern CP may overlap the mesh structure M2 of the shielding layer SL2. In some embodiments, a width W1 of the mesh structure M1 of the connection pattern CP between two first holes H1 may be equal to a width WH2 of the plurality of second holes H2, and a width W2 of the second mesh structure M2 between two second holes H2 of the shielding layer SL2 may be equal to a width WH1 of the plurality of first holes H1. In some embodiments, the plurality of second holes H2 of the shielding layer SL2 may completely offset (do not overlap) the first holes H1 of the connection pattern CP and only overlap the first mesh structure M1 of the connection pattern CP, and the plurality of first holes H1 of the connection pattern CP may completely offset from the first holes H2 (do not overlap), and only overlap the second mesh structure M2 of the shielding layer SL2. It is to be noted that the width WH1, WH2 of the plurality of first holes H1 or the plurality of second holes H2 refers to a width of each first hole H1 or each second hole H2 in a direction parallel to the substrate, respectively, and a width W1, W2 of mesh structure of the connection pattern CP or the shielding layer SL2 may refer to a width of a portion of the mesh structure of the connection pattern CP or the shielding layer SL2 between two first holes H1 or two second holes H2 adjacent to each other in the direction parallel to the substrate, respectively.

It should be appreciated that widths of the holes and the mesh structures are used as an example to describe the dimensions of the holes and the mesh structures, which do not limit the scope of the disclosure. The holes and the mesh structures may include shapes other than a quadrilateral shape and may include a dimension other than a width. For example, the holes H1, H2 may include a circle shape. The connection pattern CP and the shielding layer SL2 may be configured that each first hole H1 in the connection pattern CP does not overlap and offset from each second hole H2 in the shielding layer SL2. In the display device 600 according to an example embodiment of the present disclosure, the connection pattern CP and the shielding layer SL2 through or to which a low potential power, e.g., a constant voltage is transmitted or applied may be disposed in an area that is not covered by the second electrode 133, so that the shielding layer SL2 and the connection pattern CP may be configured to shield signal noise between the touch routing lines 154*a* and 154*b* and the emission clock lines ECLK. In the display device 600 according to an example embodiment of the present disclosure, the connection pattern CP and the shielding layer SL2 through or to which a low potential power is transmitted or applied are disposed in the non-active area N/A, so that a phenomenon in which interference between the driving signal and the touch signal occurs can be minimized or reduced.

In some embodiments, in the display device 600 according to an example embodiment of the present disclosure, the plurality of second holes H2 of the shielding layer SL2 may overlap the first mesh structure M1 of the connection pattern CP and the plurality of first holes H1 of the connection pattern CP may overlap the second mesh structure M2 of the shielding layer SL2. Also, a width of the mesh structure of the connection pattern CP may be equal to a width of the plurality of second holes H2, and a width of the mesh structure of the shielding layer SL2 may be equal to a width of the plurality of first holes H1. Thus, the plurality of second holes H2 of the shielding layer SL2 may completely offset from the first holes H1 and overlap only the first mesh structure M1 of the connection pattern CP, and the plurality of first holes H1 of the connection pattern CP may completely offset from the second holes H2 and overlap only the second mesh structure M2 of the shielding layer SL2. Accordingly, the connection pattern CP may block noise that may be introduced into the plurality of second holes H2 of the shielding layer SL2, and the shielding layer SL2 may block noise that may be introduced into the plurality of first holes H1 of the connection pattern CP. Accordingly, in the display device 600 according to an example embodiment of the present disclosure, even noise that may be introduced into the plurality of first holes H1 of the connection pattern CP and the plurality of second holes H2 of the shielding layer SL2 can be substantially blocked. Accordingly, in the display device 600 according to an example embodiment of the present disclosure, a signal-to-noise ratio of the touch signal is increased and interference between signals does not occur or is substantially reduced, so that a more stable touch sensing system in which accuracy of touch sensing can be increased, and touch sensitivity can be improved may be provided.

Also, in the display device 600 according to an example embodiment of the present disclosure, the shielding layer SL2 includes a plurality of second holes H2. Accordingly, in the display device 600 according to an example embodiment of the present disclosure, gases such as hydrogen ($H_2$) and the like that may be generated in the first planarization layer 115 and the second planarization layer 116 may be smoothly discharged through the plurality of first holes H1 and the plurality of second holes H2.

Figure 8:
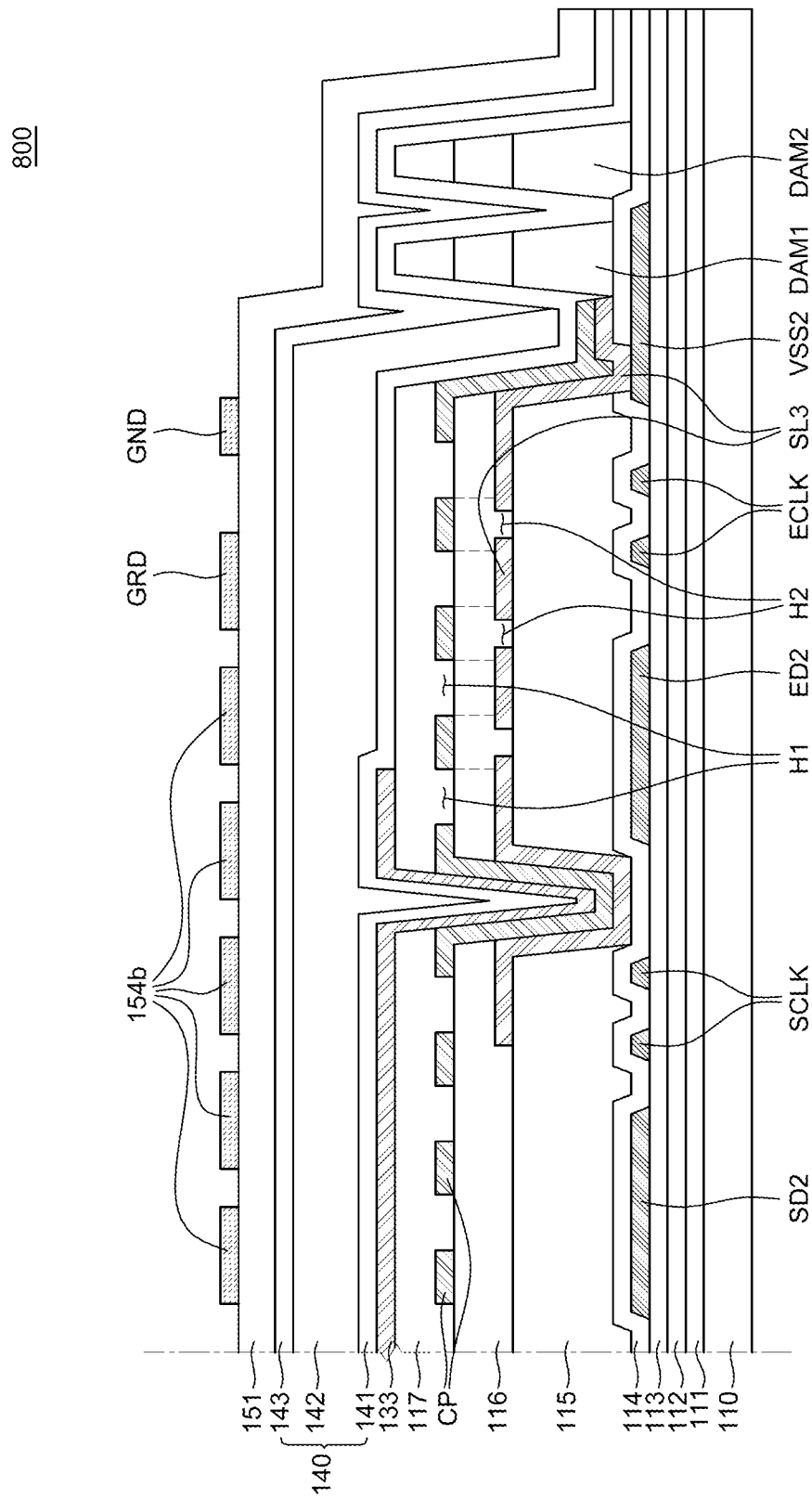
FIG. 8 is a cross-sectional view of a display device according to still an example embodiment of the present disclosure.
Figure 9:
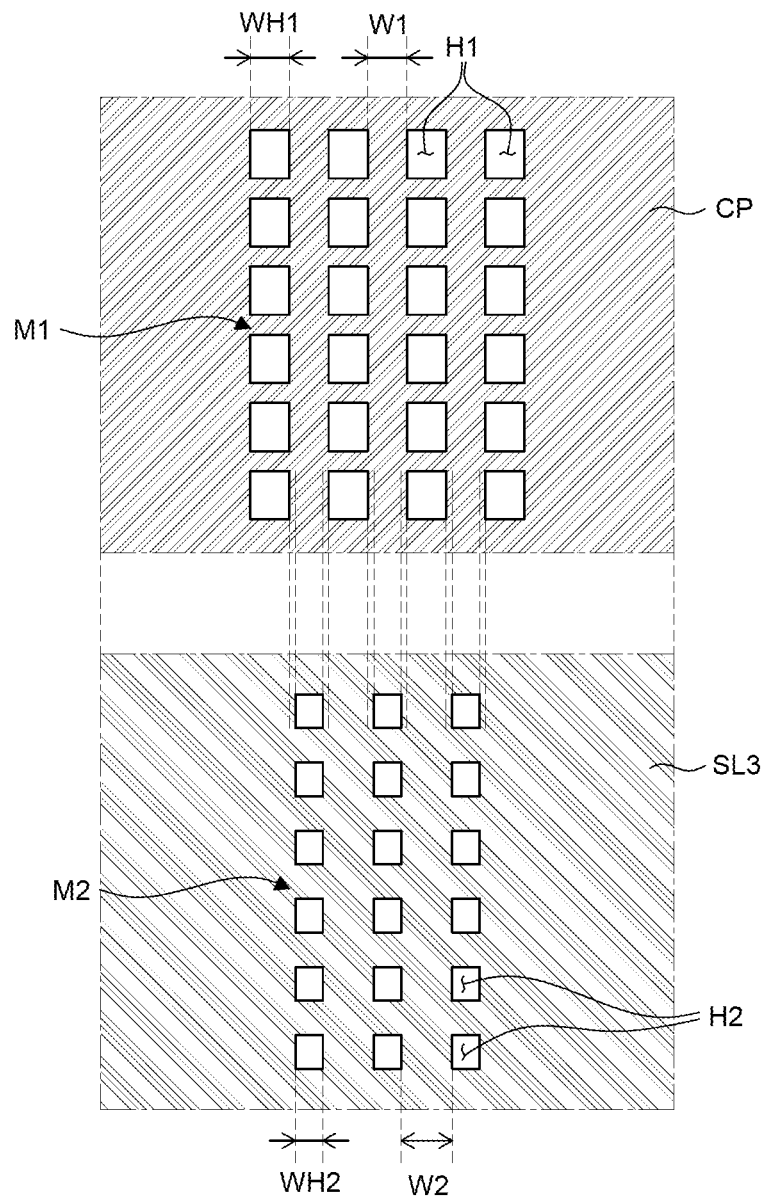
FIG. 9 is a plan view illustrating a connection pattern and a shielding layer of the display device according to still an example embodiment of the present disclosure.

FIG. 8 is a cross-sectional view of a display device according to an example embodiment of the present disclosure. FIG. 9 is a plan view illustrating a connection pattern and a shielding layer of the display device according to still an example embodiment of the present disclosure. A display device 800 of FIGS. 8 and 9 is different from the display device 600 of FIGS. 6 and 7 only in terms of a shielding layer SL3 with respect to the connection pattern CP, and other configurations thereof are substantially the same. Thus, a redundant description will be omitted.

Referring to FIG. 8, the shielding layer SL3 is disposed between the first planarization layer 115 and the second planarization layer 116. The shielding layer SL3 may be formed of the same material as the connection electrode 190 disposed between the first planarization layer 115 and the second planarization layer 116 of the active area A/A, and may be disposed on the same layer as the connection electrode 190. In some embodiments, the shielding layer SL3 may be formed by the same process as the connection electrode 190.

The shielding layer SL3 may extend over an upper portion of the second emission driver ED2 and the plurality of emission clock lines ECLK to an area between the plurality of scan clock lines SCLK and the second emission driver ED2. The shielding layer SL3 may overlap a portion of the plurality of scan clock lines SCLK, the second emission driver ED2, and the plurality of emission clock lines ECLK.

The shielding layer SL3 may be disposed vertically between the second emission driver ED2 and the plurality of emission clock lines ECLK, and the connection pattern CP. In some embodiments, one end of the shielding layer SL3 may overlap a portion of the plurality of scan clock lines SCLK, and the other end thereof may be in contact with the second low potential power line VSS2. In some embodiments, the shielding layer SL3 may be disposed on the second low potential power line VSS2 at an outer portion of the first planarization layer 115 and be electrically connected to the second low potential power line VSS2. Accordingly, a low potential power, e.g., a constant voltage, may be transmitted to the shielding layer SL3.

The connection pattern CP may be disposed on the second planarization layer 116. The connection pattern CP may be formed of the same material as the first electrode 131 of the light emitting element 130 and may be disposed on the same layer as the first electrode 131. In some embodiments, the connection pattern CP may be formed by the same process as the first electrode 131.

The connection pattern CP may be electrically connected to the second low potential power line VSS2 through the shielding layer SL3 at an outer portion of the second planarization layer 116. In some embodiments, the connection pattern CP may contact the shielding layer SL3 that is in contact with the second low potential power line VSS2 at an outer portion of the second planarization layer 116 and be electrically connected to the low potential power line VSS2. Also, a portion of the connection pattern CP may be in contact with the shielding layer SL3 that is disposed in an area between the plurality of scan clock lines SCLK and the second emission driver ED2. In some embodiments, a portion of the connection pattern CP may be connected to the shielding layer SL3 that is exposed through a contact hole formed in the second planarization layer 116 in a manner in contact with the shielding layer SL3, and may be electrically connected to the second low potential power line VSS2 through the shielding layer SL3.

Referring to FIGS. 8 and 9, the connection pattern CP may include a plurality of first holes H1. In some embodiments, the connection pattern CP has the plurality of first holes H1 and a mesh structure surrounding the plurality of first holes H1. Accordingly, the plurality of first holes H1 of the connection pattern CP may function to discharge gases such as hydrogen ($H_2$) and the like that may be generated in the first planarization layer 115 or the second planarization layer 116. For example, the first holes H1 may function for outgassing.

In some embodiments, the shielding layer SL3 may have a plurality of second holes H2 overlapping the mesh structure of the connection pattern CP. In some embodiments, the shielding layer SL3 has the plurality of second holes H2 overlapping the mesh structure of the connection pattern CP and a mesh structure surrounding the plurality of second holes H2. Accordingly, the plurality of first holes H1 of the connection pattern CP and the plurality of second holes H2 of the shielding layer SL3 may function to discharge gases such as hydrogen ($H_2$) and the like that may be generated in the first planarization layer 115 or the second planarization layer 116. For example, holes H2 may function for outgassing.

In some embodiments, the plurality of second holes H2 of the shielding layer SL3 may overlap the first mesh structure M1 of the connection pattern CP, and the plurality of first holes H1 of the connection pattern CP may overlap the second mesh structure M2 of the shielding layer SL3. Also, a width W1 of the first mesh structure M1 of the connection pattern CP may be greater than a width WH2 of the plurality of second holes H2, and a width W2 of the second mesh structure M2 of the shielding layer SL3 may be greater than a width WH1 of the plurality of first holes H1. Accordingly, the plurality of second holes H2 of the shielding layer may only overlap the first mesh structure M1 of the connection pattern CP and do not overlap the first holes H1 of the connection pattern CP, and the plurality of first holes H1 of the connection pattern CP may only overlap the second mesh structure M2 of the shielding layer SL3 and do not overlap the second holes H2 of the shielding layer SL3.

In the display device 800 according to an example embodiment of the present disclosure, the connection pattern CP and the shielding layer SL3 through or to which a low potential power that is a constant voltage is transmitted or applied are disposed in an area that is covered by the second electrode 133, so that the shielding layer SL3 and the connection pattern CP may be configured to serve to shield signal noise between the touch routing lines 154a and 154b and the emission clock lines ECLK. Accordingly, in the display device 800 according to still an example embodiment of the present disclosure, the connection pattern CP and the shielding layer SL3 through or to which a low potential power is transmitted or applied are disposed in the non-active area N/A, so that a phenomenon in which interference between the driving signal and the touch signal occurs can be minimized or reduced.

For example, in the display device 800 according to still an example embodiment of the present disclosure, the plurality of second holes H2 of the shielding layer SL3 may overlap the first mesh structure M1 of the connection pattern CP, and the plurality of first holes H1 of the connection pattern CP may overlap the second mesh structure M2 of the shielding layer SL3. Also, a width W1 of the first mesh structure M1 of the connection pattern CP may be greater than a width WH2 of the plurality of second holes H2, and a width W2 of the second mesh structure M2 of the shielding layer SL3 may be greater than a width WH1 of the plurality of first holes H1. Accordingly, since the width M2 of the second mesh structure of the shielding layer SL3 disposed below the plurality of first holes H1 of the connection pattern CP is greater than the width WH1 of the plurality of first holes H1, noise that may be introduced through the plurality of first holes H1 may be more efficiently blocked by the second mesh structure M2 of the connection pattern CP. Also, since the width W1 of the first mesh structure M1 of the connection pattern CP disposed on the plurality of second holes H2 of the shielding layer SL3 is greater than the width WH2 of the plurality of second holes H2, noise that may be introduced through the plurality of second holes H2 may be more effectively blocked by the first mesh structure of the connection pattern CP. Accordingly, in the display device 800 according to still an example embodiment of the present disclosure, even noise that may be introduced into the plurality of first holes H1 of the connection pattern CP and the plurality of second holes H2 of the shielding layer SL3 can be completely or substantially blocked. Accordingly, in the display device 800 according to still an example embodiment of the present disclosure, since a signal-to-noise ratio of the touch signal is increased and interference between signals does not occur or is reduced, a more stable touch sensing system in which accuracy of touch sensing can be increased, and touch sensitivity can be improved may be provided.

It should be appreciated that widths of the holes and the mesh structures are used as an example to describe the dimensions of the holes and the mesh structures, which do not limit the scope of the disclosure. The holes and the mesh structures may include shapes other than a quadrilateral shape and may include a dimension other than a width. For example, the holes H1, H2 may include a circle shape. The connection pattern CP and the shielding layer SL3 may be configured that each first hole H1 in the connection pattern CP does not overlap and offset from each second hole H2 in the shielding layer SL3. A first dimension, e.g., diameter, of a first hole H1 in a first direction is equal to or smaller than a second dimension of the second mesh structure M2 between two adjacent second holes H2 of the shielding layer SL3 in the first direction.

Also, in the display device 800 according to still an example embodiment of the present disclosure, the shielding layer SL3 includes the plurality of second holes H2. Accordingly, in the display device 800 according to still an example embodiment of the present disclosure, gases such as hydrogen ($H_2$) and the like that may be generated in the first planarization layer 115 and the second planarization layer 116 may be smoothly discharged through the plurality of first holes H1 and the plurality of second holes H2.

The example embodiments of the present disclosure can also be described as follows:

According to an aspect of the present disclosure, a display device according to an example embodiment of the present disclosure may include a substrate including an active area including a plurality of pixels, and a non-active area; a plurality of light emitting elements disposed in the active area on the substrate; an emission driver and a plurality of emission clock lines disposed in the non-active area; a connection pattern disposed above the emission driver and the plurality of emission clock lines in the non-active area and formed of the same material as an anode of the light emitting element; an encapsulation layer disposed on the plurality of light emitting elements and the connection pattern; a touch sensing unit disposed on the encapsulation layer in the active area; a low potential power line disposed more outwardly than the plurality of emission clock lines in the non-active area; and a shielding layer disposed between the connection pattern, and the emission driver and the plurality of emission clock lines in the non-active area and electrically connected to the low potential power line.

The display device may further comprise a first planarization layer disposed on the emission driver and the plurality of emission clock lines.

The shielding layer may be disposed on the low potential power line at an outer portion of the first planarization layer and may be electrically connected to the low potential power line.

A second planarization layer may be disposed on the shielding layer.

The connection pattern may be disposed on the second planarization layer.

The connection pattern may be electrically connected to the low potential power line through the shielding layer at an outer portion of the second planarization layer.

The connection pattern may have a plurality of first holes and a mesh structure surrounding the plurality of first holes.

The shielding layer may have a single-layer structure overlapping the plurality of first holes and the mesh structure.

One end of the shielding layer may overlap the emission driver and the other end of the shielding layer may contact the low potential power line.

The display device may further comprise a scan driver and a plurality of scan clock lines disposed between the active area and the emission driver in the non-active area.

The shielding layer may extend from an upper portion of the emission driver and the plurality of emission clock lines to an area between the plurality of scan clock lines and the emission driver.

A portion of the connection pattern may be in contact with the shielding layer disposed in the area between the plurality of scan clock lines and the emission driver.

The display device may further comprise a second planarization layer disposed on the shielding layer.

A portion of the connection pattern may be connected to the shielding layer exposed through a contact hole formed in the second planarization layer.

The connection pattern may have a plurality of first holes and a mesh structure surrounding the plurality of first holes.

The shielding layer may have a plurality of second holes overlapping the mesh structure.

A width of the mesh structure may be equal to a width of the plurality of second holes.

The width of the mesh structure may be greater than a width of the plurality of second holes.

The display device may further comprise a plurality of transistors respectively connected to the plurality of light emitting elements on the active area and including an active layer, a source electrode, a gate electrode, and a drain electrode; a first planarization layer disposed on the transistors; a connection electrode disposed on the first planarization layer and connected to the drain electrode of the transistor through a contact hole formed in the first planarization layer; and a second planarization layer disposed on the connection electrode.

An anode of the light emitting element may be disposed on the second planarization layer and may be connected to the connection electrode by a contact hole formed in the second planarization layer.

The shielding layer may be formed of the same material as the connection electrode and may be disposed on the same layer as the connection electrode.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
    a substrate including an active area including a plurality of pixels, and a non-active area;
    a plurality of light emitting elements disposed in the active area on the substrate;
    an emission driver and a plurality of emission clock lines disposed in the non-active area;
    a passivation layer on the emission driver and the plurality of emission clock lines;
    a first planarization layer on the passivation layer;
    a connection pattern disposed on the first planarization layer above the emission driver and the plurality of emission clock lines in the non-active area, the connection pattern having a same material as an anode of the light emitting element;
    a touch sensing unit disposed above the plurality of light emitting elements in the active area;
    a low potential power line disposed in the non-active area and under the passivation layer; and
    a shielding layer disposed between the connection pattern and one or more of the emission driver or the plurality of emission clock lines in the non-active area, the shielding layer electrically connected to the low potential power line through a first connection hole in the passivation layer, the shielding layer in contact with the passivation layer through a second connection hole in the first planarization layer, the second connection hole spaced away from the first connection hole.

2. The display device of claim 1, further comprising:
    an encapsulation layer disposed on the plurality of light emitting elements and the connection pattern,
    wherein the touch sensing unit is disposed on the encapsulation layer in the active area.

3. The display device of claim 1, wherein the touch sensing unit includes a plurality of touch electrodes disposed in the active area and a plurality of touch routing lines disposed in the non-active area.

4. The display device of claim 3, wherein the plurality of touch routing lines overlap the one or more of the emission driver or the plurality of emission clock lines in the non-active area, and
    wherein the connection pattern and the shielding layer are disposed between the plurality of touch routing lines, and the one or more of the emission driver or the plurality of emission clock lines.

5. The display device of claim 3, wherein a cathode of the plurality of light emitting elements extends to overlap a first portion of the plurality of touch routing lines, and
    wherein a second portion of the plurality of touch routing lines that are not overlapped with the cathode overlap with the connection pattern and the shielding layer.

6. The display device of claim 1, wherein the low potential power line is disposed more outwardly with respect to the active area than the plurality of emission clock lines.

7. The display device of claim 6,
    wherein the shielding layer is disposed on the low potential power line at an outer portion of the first planarization layer.

8. The display device of claim 7, wherein a second planarization layer is disposed on the shielding layer,
    the connection pattern is disposed on the second planarization layer, and
    the connection pattern is electrically connected to the low potential power line through the shielding layer at an outer portion of the second planarization layer.

9. The display device of claim 8, wherein the connection pattern has a plurality of first holes and a mesh structure surrounding the plurality of first holes, and
    the shielding layer has a single-layer structure overlapping the plurality of first holes and the mesh structure.

10. The display device of claim 9, wherein an end of the shielding layer overlaps the emission driver and another end of the shielding layer contacts the low potential power line.

11. The display device of claim 7, further comprising:
    a scan driver and a plurality of scan clock lines disposed between the active area and the emission driver in the non-active area, wherein the shielding layer extends over the emission driver and the plurality of emission clock lines to an area between the plurality of scan clock lines and the emission driver, and a portion of the connection pattern is in contact with the shielding layer disposed in the area between the plurality of scan clock lines and the emission driver.

12. The display device of claim 11, further comprising:

a second planarization layer disposed on the shielding layer, the second planarization layer including a contact hole, wherein the portion of the connection pattern is in contact with the shielding layer through the contact hole.

13. The display device of claim 11, wherein the connection pattern has a plurality of first holes and a first mesh structure surrounding the plurality of first holes, and the shielding layer has a plurality of second holes overlapping the first mesh structure.

14. The display device of claim 13, wherein a width of the first mesh structure between two adjacent first holes is equal to a width of each of the plurality of second holes.

15. The display device of claim 13, wherein a width of the first mesh structure between two adjacent first holes is greater than a width of each of the plurality of second holes.

16. The display device of claim 1, further comprising:

a plurality of transistors respectively connected to the plurality of light emitting elements on the active area and including an active layer, a source electrode, a gate electrode, and a drain electrode;

a first planarization layer disposed on the transistors;

a connection electrode disposed on the first planarization layer and connected to the drain electrode of the transistor through a contact hole formed in the first planarization layer; and a second planarization layer disposed on the connection electrode, wherein an anode of the light emitting element is disposed on the second planarization layer and is connected to the connection electrode by a contact hole formed in the second planarization layer, and the shielding layer include a same material as the connection electrode and is disposed on a same layer as the connection electrode.

17. A display device comprising:

a substrate including an active area and a non-active area;

a plurality of light emitting elements disposed in the active area, the plurality of light emitting elements including a cathode electrode that extends into the non-active area;

an emission driver and a plurality of emission clock lines disposed in the non-active area, one or more of the emission driver or the plurality of emission clock lines being offset from the cathode;

a passivation layer on the emission driver and the plurality of emission clock lines;

a first planarization layer on the passivation layer;

a connection pattern disposed on the first planarization layer over the emission driver and the plurality of emission clock lines, the connection pattern in contact with the passivation layer through a first connection hole in the first planarization layer, the cathode electrode extending in the first connection hole on the connection pattern;

a touch sensing unit disposed over the plurality of light emitting elements in the active area; and a shielding layer disposed vertically between the connection pattern and the one or more of the emission driver or the plurality of emission clock lines that are offset from the cathode.

18. The display device of claim 17, wherein the connection pattern includes a first plurality of first holes, and the shielding layer includes a second plurality of second holes, the second plurality of second holes each offset from the first plurality of first holes.

19. The display device of claim 18, wherein a first dimension of a first hole of the first plurality of first holes in a first direction is equal to or smaller than a second dimension of the shielding layer between two adjacent second holes of the second plurality of second holes in the first direction.

20. The display device of claim 18, wherein the shielding layer is in contact with a voltage terminal on a same level as the emission driver and the plurality of emission clock lines.

* * * * *